United States Patent [19]

Heermann

[11] Patent Number: 5,784,422
[45] Date of Patent: Jul. 21, 1998

[54] APPARATUS AND METHOD FOR ACCURATE SYNCHRONIZATION WITH INBOUND DATA PACKETS AT RELATIVELY LOW SAMPLING RATES

[75] Inventor: Douglas A. Heermann, Raymond, Nebr.

[73] Assignee: Transcrypt International, Inc., Lincoln, Nebr.

[21] Appl. No.: 692,539

[22] Filed: Aug. 5, 1996

[51] Int. Cl.$^6$ ................................................ H04L 7/08
[52] U.S. Cl. .......................... 375/355; 375/362; 375/371; 380/48; 348/512; 348/537
[58] Field of Search ................................. 375/219, 354, 375/355, 357, 362, 364, 365, 366, 367, 368, 371, 373, 376, 208; 370/503, 516, 518; 380/48; 348/512, 515, 536, 537

[56] References Cited

U.S. PATENT DOCUMENTS

| | | |
|---|---|---|
| 3,878,473 | 4/1975 | Furtney, Jr. ........................ 331/1 A |
| 4,757,536 | 7/1988 | Szczutkowski et al. .................. 380/48 |
| 4,807,248 | 2/1989 | Pyatt et al. ........................ 375/366 |
| 4,817,142 | 3/1989 | Van Rassel . |
| 4,856,063 | 8/1989 | McCalmont . |
| 4,903,279 | 2/1990 | Murakami et al. . |
| 5,278,907 | 1/1994 | Snyder et al. . |
| 5,283,831 | 2/1994 | Cook et al. . |
| 5,287,384 | 2/1994 | Avery et al. . |
| 5,297,162 | 3/1994 | Lee et al. . |
| 5,400,368 | 3/1995 | Cheng et al. ........................ 375/354 |
| 5,459,524 | 10/1995 | Cooper ........................ 348/507 |

*Primary Examiner*—Don N. Vo
*Assistant Examiner*—Amanda T. Le
*Attorney, Agent, or Firm*—Zarley,McKee,Thomte, Voorhees, & Sease

[57] ABSTRACT

An apparatus and method for accurate synchronization with inbound audio data which packets at relatively low sampling rates. By using previously known information such as the time of arrival of the beginning of the data packet, a reference timer in a digital signal processor can be used to calculate a number of samples and/or portions thereof between a beginning reference time and the beginning of a data packet, and then calculate the timing error between the first sample point after the arrival of the data packet and the beginning of the data packet. Using this information, the actual arrival of the data packet can be derived and utilized to very accurately, within very small margins of error, synchronize the beginning of the data packet with the scrambling algorithm used in the receiver.

3 Claims, 3 Drawing Sheets

APPARATUS AND METHOD FOR ACCURATE SYNCHRONIZATION WITH INBOUND DATA PACKETS AT RELATIVELY LOW SAMPLING RATES

BACKGROUND OF THE INVENTION

A. Field of the Invention

This invention relates to transmissions of scrambled audio, and particularly to accurate synchronization of a receiver to a scrambling methodology operating on a received signal comprising scrambled audio and intermittent synchronization data bursts.

B. Problems in the Art

In most types of audio scrambling, synchronization of the receiver to the scrambling method contained in the transmitted signal is essential for successful descrambling. One form of scrambling operates upon an audio waveform in a pseudo-random fashion. The transmitter and receiver can operate successfully by virtue of each component having a pseudo-random algorithm in place prior to transmission. Synchronization data to allow the receiver to know the position in the pseudo-random algorithm used to encode or scramble the audio can be placed in data packets or bursts that are intermittently presented in the transmitted signal.

One way to modulate the synchronization data into the analog transmission signal is using PSK (Phase Shift Key) procedures such as are well known in the art.

The data bursts or packets themselves are contained in the transmitted signal in a pseudo-random fashion. They are also relatively short in duration to minimize the amount of interruption of the audio signal.

It is essential that the data in these bursts be extracted. This means not only that the data must actually be extracted, but also that the extraction be done accurately and that data in the bursts not be missed. Without complete and accurate information from the synchronization data bursts, synchronization may not be possible and valuable audio information may be lost. For example, with regard to PSK data, such data enables a phase lock loop (PLL) arrangement to quickly lock in on synchronization data that is modulated onto a carrier frequency.

One method to address the concern of obtaining accurate and complete synchronization data is to employ a relatively high sampling rate of the transmitted signal. By doing so, sample points are more likely to exist very close to the beginning of each data packet thus increasing the likelihood that complete and accurate synchronization data will be obtained. However, the disadvantages of employing a relatively high sampling rate versus a relatively lower sampling rate are well known.

To avoid relatively high sampling rates, attempts have been made at compensating for any timing error that might occur at relatively lower sampling rates, i.e. compensating for information contained between the receipt of the beginning of the data packet at the receiver and the first sample point of the data packet taken by the receiver. If not compensated for, theoretically almost an entire sample period might go by before the data packet is sampled, and with it would be lost the information in that part of the data packet. Moreover, that loss of information may not allow for sufficient derivation of synchronization information needed to allow accurate descrambling, at least until a future event where synchronization can be achieved.

The advantages of utilizing a low sample rate make it attractive to pursue timing error compensation methods as a form of insuring accurate extraction of synchronization data. One prior art method utilizes a software counter which counts timer interrupts with changing intervals to determine where to sample the data. It is emphasized this method uses a variable timer interval methodology.

The present invention is implemented at least in part in a digital signal processor (DSP) where the only available clock or timing reference periods are at a fixed sampling rate. Therefore, the prior art method of using variable timing intervals is not available.

The advantages of using a DSP are well known in the art. Therefore there is a real need in the art to utilize relatively low sampling rates in the descrambling of a transmitted signal which includes audio and synchronization data bursts, without any other timing information or hardware than contained in the DSP. It is therefore a principle object of the present invention to provide an apparatus and method which overcomes the problems and deficiencies in the art.

Other objects of the invention include the provision of an apparatus and method which:

(a) allows accurate synchronization with the signal which does not necessarily begin on sample boundaries, even when using the low sample rate.

(b) utilizes the sampling rate of a DSP as a reference clock in a timing compensation method.

(c) takes advantage of previously known information regarding the presence of the data bursts to facilitate timing compensation.

These and other objects, features, and advantages of the present invention will become more apparent with reference to the accompanying specification and claims.

SUMMARY OF THE INVENTION

Figure 1:
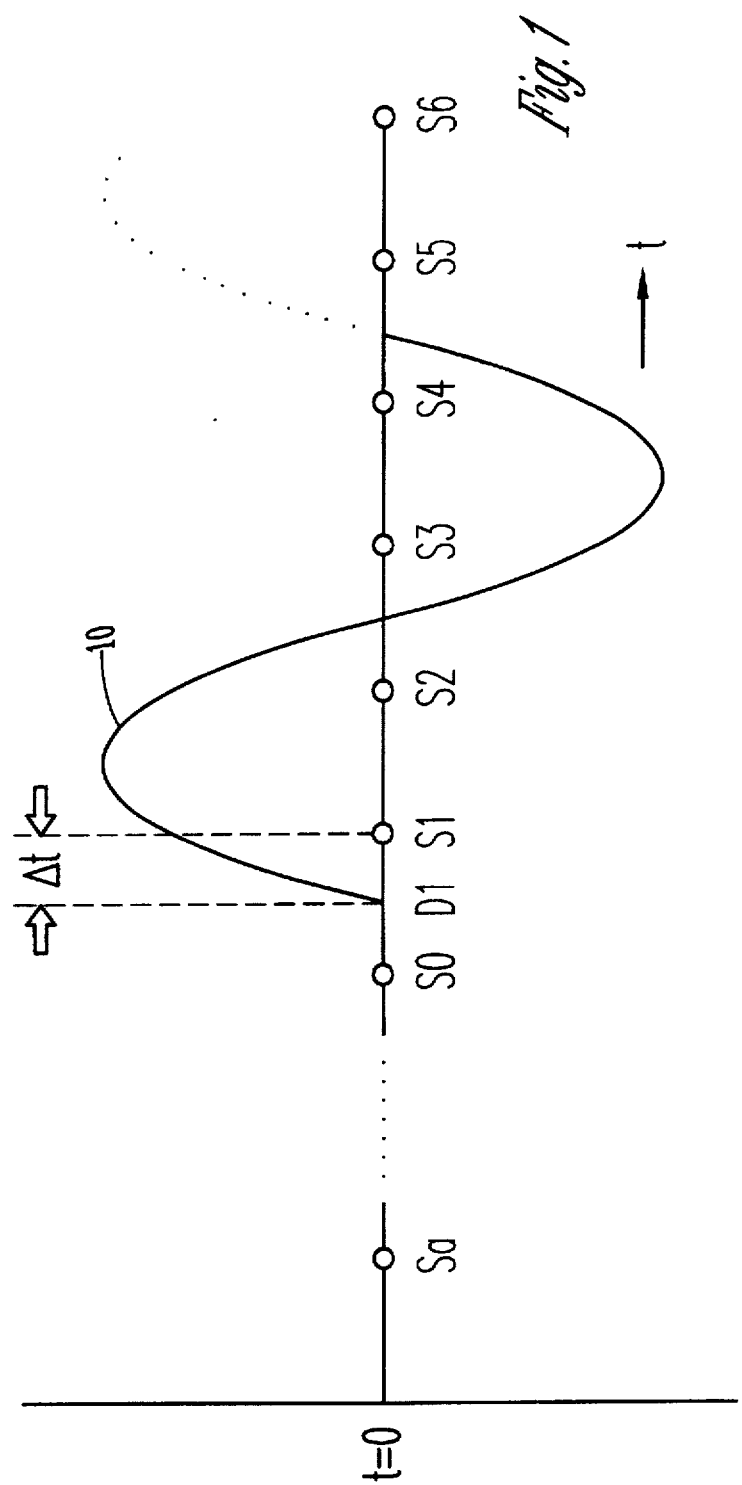
FIG. 1 is a graphical depiction of a data packet to illustrate the operation of the present invention.
Figure 2:
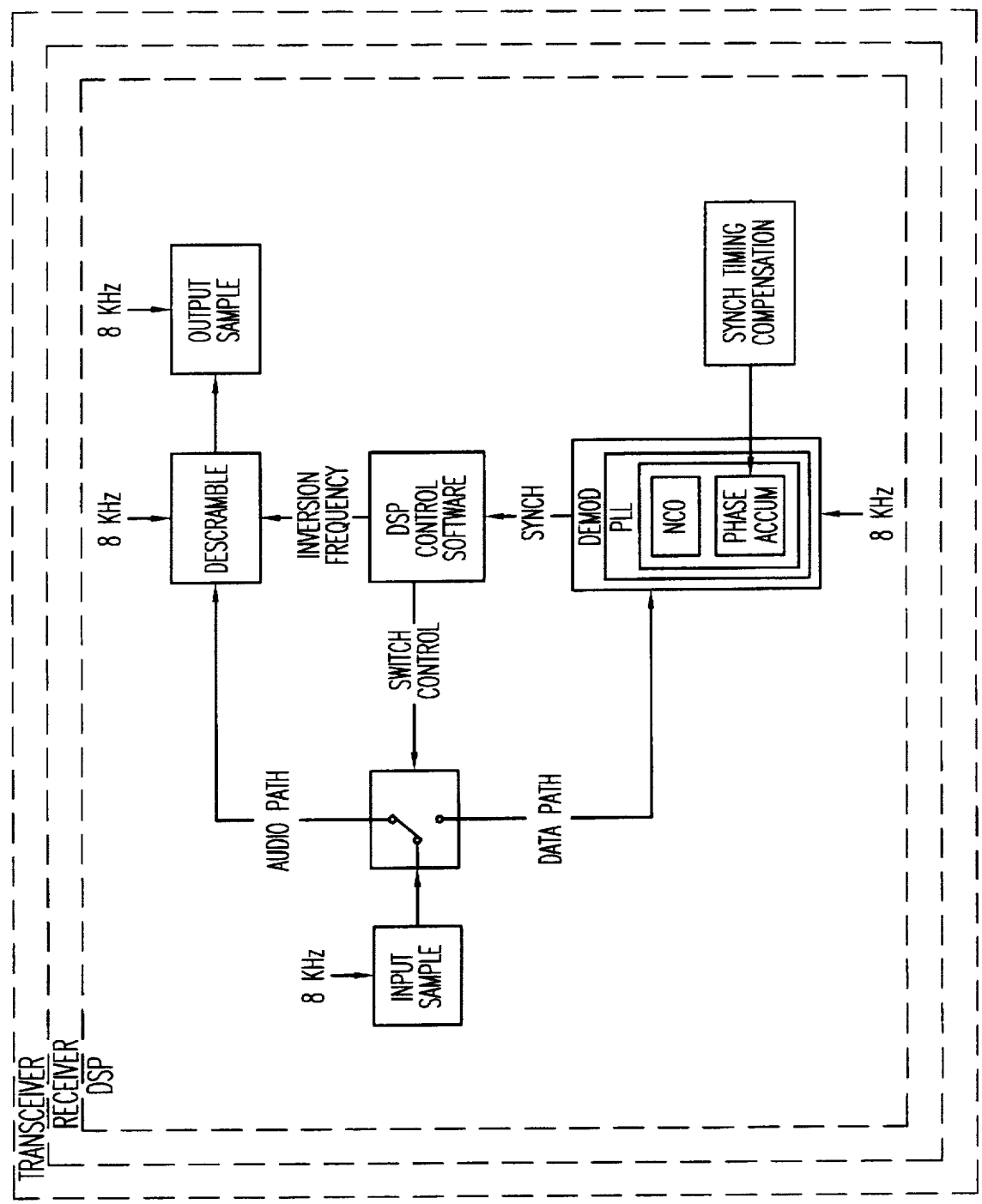
FIG. 2 is a block diagram of an apparatus according to a preferred embodiment of the present invention.
Figure 3:
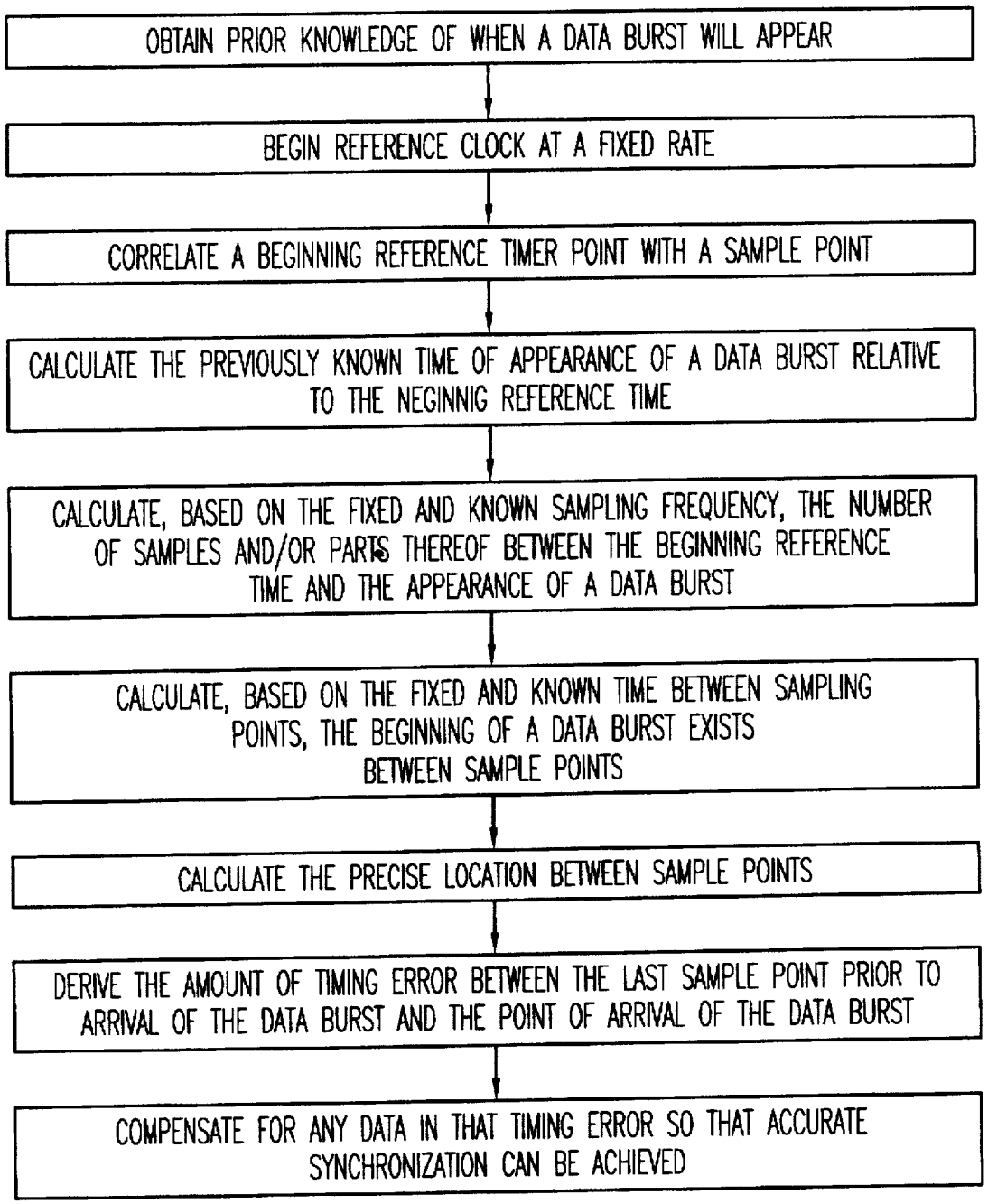
FIG. 3 is a flow chart of a method according to a preferred embodiment of the present invention.

The present invention includes a method for accurate synchronization of an audio signal containing periodic intermittent synchronization data bursts. The method assumes that a control device, which can be a digital signal processor, has prior knowledge of when a data burst will appear. An object of the invention is to utilize a relatively low sampling rate, although the reference clock will time at a fixed rate. The method therefor correlates a beginning reference timer point with a sample point. The previously known time of appearance of a data burst can then be calculated relative to the beginning reference time. Because the sampling frequency is fixed and known, the number of samples and/or parts thereof between the beginning reference time and the appearance of a data burst can be calculated. Additionally, because the time between sampling points is fixed and known, if the beginning of a data burst exists between sample points, the precise location between sample points can be calculated. This in turn can be used to derive the amount of timing error between the last sample point prior to arrival of the data burst and the point of arrival of the data burst, which in turn allows compensation for any data in that timing error so that accurate synchronization can be achieved.

The apparatus according to the invention utilizes a reference clock with a fixed rate, a sampling configuration that is correlated to the reference clock, and a digital processor which can receive information with respect to when a data burst will appear, calculate where that will fall with respect to sample points, calculate the position of where that will fall relative the first data sample point; and from that information obtain accurate synchronization.

DETAILED DESCRIPTION OF THE PREFERRED EMBODIMENT

To better understand the invention, one embodiment will now be described in detail. The description will refer to FIG. 1 and will utilize reference numerals to indicate various points or locations in the FIG. 1.

The apparatus of the preferred embodiment relates to conventional equipment used in communications, and particularly, to audio communications via wireless transceivers. The transceivers according to the present invention implement many of their functions in a digital signal processor (DSP).

In this embodiment, the transmitter part of the transceiver takes audio (e.g. speech) and samples the analog audio wave at a certain frequency. A scrambling technique or method is utilized to scramble or encode the samples speech and transmit it for communication security purposes. In the preferred embodiment there are periodic, intermittent, data packets in bursts containing PSK synchronization data entrained with the scrambled audio. These bursts are digital information that will allow the receiver to synchronize its operation to the time dependent scrambling method used by the transmitter.

That digital data is modulated into the carrier frequency for a transmitted signal. Therefore, the transmitted signal contains periods of scrambled audio with short periods of modulated synchronization data.

In the preferred embodiment, the receiver receives the radio energy over a compatible channel to the carrier wave and samples that combined scrambled audio/synchronization data signal at the same rate as it was sampled in the transmitter.

By one of a variety of methods, the receiver extracts the synchronization data from the data burst portion of the incoming signal. It attempts to derive the necessary information to accurately synchronize to the time dependent scrambling method of the transmitted signal so that accurate descrambling can take place.

In the preferred embodiment the receiver implements a phase lock loop in software in the DSP to demodulate synchronization data into a digital form that can be used for descrambling in the DSP. To ensure that none of the data is missed, the phase locked loop of the receiver must be locked to the data at the beginning of the synchronization packet.

In the preferred embodiment, the sampling rate described above is relatively low. Therefore, this increases the risk of a timing error between a sample point and the beginning of the data packet. More precisely it increases the risk that a relatively large time will exist between a sample point and the beginning of the data packet and that the data in that missed time will prevent accurate lock up of the phase lock loop to the beginning of the synchronization packet.

The phase locked loop (PLL) used by the invention is a digital implementation of an analog Costas loop, such as is well known in the art. Such a loop generally uses a voltage controlled oscillator in its analog form but in the present invention this component is modeled in the DSP by a numerically controlled oscillator using a 16 bit phase accumulator. In order for the PLL to be locked to the signal when the first data sample is processed, the phase accumulator of the NCO must be at the correct phase. This initial phase value corresponds to a value $\Delta t$ which is less than one sampling interval of the DSP. The accuracy at which $\Delta t$ can be computed depends on the quantization of a reference timer that is incremented by a certain value every time a sample is processed by the DSP. This increment value determines the resolution of the time and hence the error in $\Delta t$.

Operation of the invention in a preferred embodiment is set forth by referring to the graph at FIG. 1.

The horizontal axis represent time. The oscillating waveform 10 is a diagrammatical representation of a data packet or burst, with D1 indicating the beginning of the data packet. Note that the audio portions of the transmitted signal are not shown. Points SA, . . . , S0, S1, S2, S3, S4, S5, S6 . . . represent sample points at the fixed sampling frequency of the DSP relative to data packet 10.

As previously discussed, operation of the invention requires that certain information be known prior to the timing correction taking place. First of all, $T_0$, the beginning of the reference counter, and D1 are determined from data that was previously received. This assumption is based on the fact that the last data received was either the initialization vector or other synchronization update information much like data packet 10.

Secondly, $T_0$ is correlated not only with the start of a reference counter in the DSP, but is also correlated to a sample time or point. Therefore, any point along axis t can be calculated to be either equally divisible into a number of samples, or divisible into a number of samples plus a portion or fraction thereof.

In the preferred embodiment, the reference timer starting time is t0 (t=0) (see FIG. 1) and is incremented by a value of 65.536 every time a sample is processed, or in other words, incremented 65.536 after each sample point S. The sampling rate used is 8 kHz (8,000 samples per second) giving a timer resolution of 1.9 microseconds (µs) based on the following calculation:

$$\frac{1}{8000 \frac{\text{samples}}{\text{sec}} \times \frac{65.536}{\text{sample}}} = 1.9 \, \mu s$$

At t=D1, the data packet first appears. However, because of the particular sampling rate employed (a relatively low sample rate) the first data sample is taken at t=S1. Thus, $\Delta t$ equals the offset between D1 and S1 and represents the amount of information of the data packet that is missing from the sampling process.

In the preferred embodiment, D1 was previously computed to be the value 101,750. By dividing 65.536 (the value attributed to time between samples) into 101,750 (the value of the time between $T_0$ and D1), the number of samples that occurred over time D1 can be calculated, namely 1552.58 samples.

It can therefore be seen that the start of the data packet D1 begins between sample number 1552 and 1553 (in FIG. 1, sample points S0 and S1). Therefore, $\Delta t$ can be computed as follows:

$\Delta t = (65.536 \times 1553) - 101750 = 27.408 = 0.42$ samples

Thus, $\Delta t$ is 27.408 timer values. By comparing this number to 65.536, the timer value for the period between samples, it can be easily computed that $\Delta t$ is 0.42 or 42% of that period. Having this information thus allows the DSP to know how much of the beginning of the data packet existed prior to the first sample point S1.

In the implementation of the preferred embodiment, what is left to accurately synchronize the receiver with respect to this type of scrambling is to convert the value of Δt to a corresponding phase accumulator value for the carrier frequency of the synchronization data so that the local oscillator of the phase locked loop starts at the correct phase.

This can be done utilizing the following computations. A 16 bit phase accumulator can have $2^{16}$ values; that is, 65536 quantized phased values. A phase increment can be calculated by multiplying a carrier frequency f times the number of quantized phase values divided by the sampling rate or frequency. If one assumes the carrier frequency f is equal to 2,000.Hz, the phase increment can be calculated as follows:

$$\text{phase increment} = \frac{65536 \times f}{8000} \text{ (per sample)}$$

Because of the previously calculated knowledge of the value of Δt, the initial phase value can be calculated as follows:

$$\frac{\text{initial}}{\text{phase value}} = 0.42 \text{ sample} = \frac{27.408}{65.536} \times \frac{65536 \times 2000}{8000}$$

Which results in an initial phase value of 27.408×250= 6852.

Using the initial phase value in the phase accumulator, the phase locked loop can then be started and will be at the proper phase to lock to the data and receive it immediately. Therefore, the invention can be used to receive synchronization data packets which are transmitted pseudo-randomly within a stream of scrambled audio from a scrambling module installed in the transmitting radio. This data will allow the descrambling module in the receiving radio to maintain synchronization with the scrambling algorithm in the transmitter so that the scrambled audio can be recovered properly. The invention will only be enabled after the receiving descrambler has received an initialization vector by which the descrambling algorithm is started.

The included preferred embodiment is given by way of example only and not be way of limitation to the invention, which is solely described by the claims herein. Variations obvious to one skilled in the art will be included within the invention defined by the claims.

For example, the methodology of the invention works with a variety of different sampling rates and carrier frequencies.

What is claimed:

1. A method for accurate synchronization of an audio signal with periodic synchronization data bursts comprising data modulated into a carrier frequency, implemented in a receiver having a digital signal processor with a reference timer having a fixed rate, using a relatively low sampling rate and having prior knowledge of when a data burst will appear comprising:

beginning the reference timer at a time to which correlates $t_0$ with an occurrence of a sample point;

calculating the amount of time between $t_0$ and the previously known time a data burst will appear;

calculating number and/or fractions of number of sample points between $t_0$ and the previously known time a data burst will appear;

calculating a time Δt between the previously known time a data burst will appear and a next sample point;

converting Δt into a percentage of the time between sample points;

converting Δt to a corresponding phase accumulator value for the carrier frequency of the synchronization data so that a local oscillator of a phase locked loop starts at a correct phase and the receiver is accurately synchronized with the audio signal when transmitted.

2. An apparatus for accurate synchronization of an analog signal comprising an audio signal with periodic synchronization data bursts modulated into a carrier frequency, using relatively low sampling rates and having prior knowledge of when a data burst will appear comprising:

a transceiver including a receiving circuit for receiving the analog signal;

a digital signal processor in the receiving circuit;

a phase locked loop implemented in the digital signal processor to demodulate synchronization data in the data bursts in the analog signal;

a numerically controlled oscillator implemented in the digital signal processor and having a phase accumulator;

a fixed rate reference clock implemented in the digital signal processor;

the reference clock starting at a time to which is correlated to a sample point;

the digital signal processor sampling the analog signal at a relatively low sample rate related to the rate of the fixed rate clock;

the prior knowledge of when a data burst will appear being compared with $t_0$, and the comparison used to alter the phase accumulator to provide synchronization timing compensation for any difference found in the comparison.

3. A method of compensating for timing error to allow accurate synchronization of a receiver to a transmitted signal comprising scrambled audio with intermittent data bursts of synchronization data while sampling the transmitted signal at a relatively low sample rate compared to the frequency of data bursts comprising:

obtaining prior knowledge of a time $t_d$ of a data burst relative to a reference time $t_0$;

coinciding $t_0$ with a sample point and sampling the transmitted signal at a fixed and known rate every $t_s$;

dividing $t_d$ by $t_s$ to determine the number of samples taken over $t_d$;

if the number of samples taken over $t_d$ equals a whole number, setting a timing error Δt between a sample point and the beginning of synchronization to be zero;

if the number of samples taken over $t_d$ does not equal a whole number, calculating Δt; converting Δt to a percentage of a sample period $t_s$; and converting the percentage of a sample period into a value that can be used to compensate for the timing error to accurately synchronize the receiver to the transmitted signal.

* * * * *

UNITED STATES PATENT AND TRADEMARK OFFICE
CERTIFICATE OF CORRECTION

PATENT NO. : 5,784,422
DATED : July 21, 1998
INVENTOR(S) : Douglas A. Heermann

It is certified that error appears in the above-identified patent and that said Letters Patent is hereby corrected as shown below:

In claim 1, column 5, line 57, please delete [time to] and substitute --time $t_0$--.

In claim 2, column 6, line 29, please delete [time to] and substitute --time $t_0$--.

Signed and Sealed this

Sixth Day of October, 1998

Attest:

BRUCE LEHMAN

*Attesting Officer*     *Commissioner of Patents and Trademarks*